US008055008B1

(12) United States Patent
Davis

(10) Patent No.: US 8,055,008 B1
(45) Date of Patent: Nov. 8, 2011

(54) SOUND AMPLIFYING GUITAR STAND

(76) Inventor: Larry Steven Davis, The Colony, TX (US)

( * ) Notice: Subject to any disclaimer, the term of this patent is extended or adjusted under 35 U.S.C. 154(b) by 1240 days.

(21) Appl. No.: 11/708,751

(22) Filed: Feb. 21, 2007

(51) Int. Cl.
*H04R 1/02* (2006.01)
*H03F 99/00* (2009.01)
*G10D 13/02* (2006.01)

(52) U.S. Cl. ........... 381/388; 381/386; 381/120; 84/421

(58) Field of Classification Search .................. 381/388, 381/386, 395, 120, 118, 345, 182, 374; 84/441 R, 84/421, 453, 327; 248/404, 405
See application file for complete search history.

(56) References Cited

U.S. PATENT DOCUMENTS 4,348,930 A * 9/1982 Chobanian et al. ............ 84/726
6,891,099 B1 5/2005 Davis et al.

* cited by examiner

*Primary Examiner* — Tuan Nguyen
(74) *Attorney, Agent, or Firm* — William W. Haefliger

(57) ABSTRACT

A sound amplifying guitar stand, the combination comprising a stand having a guitar back supporting panel extending upright, support legs, and a sound amplifier supported proximate to and at the rear of the panel, the panel configured to pass amplified audio sound forwardly, when a guitar is lifted off the stand.

17 Claims, 2 Drawing Sheets

SOUND AMPLIFYING GUITAR STAND

BACKGROUND OF THE INVENTION

This invention relates generally to guitar support stands, and more particularly to a functionally cooperative combination of a loudspeaker assembly, including a cabinet with a guitar support stand, to provide highly effective multi-functional apparatus.

There is need for apparatus as referred to; and also there is need for apparatus having the highly advantageous features of construction, operation, and results, as are disclosed herein.

SUMMARY OF THE INVENTION

It is a major object of the invention to provide the multi-function apparatus as referred to above. Basically, the apparatus comprises a) a stand having a guitar back supporting panel extending upright, and support legs, b) a sound amplifier supported proximate to and at the rear of the panel, c) the panel configured to pass amplified audio sound forwardly, when a guitar is lifted off the stand.

As will be seen, the guitar supporting panel typically defines a sound passing opening, or openings, in sound passing registration with an amplifier speaker or speakers.

Another object is to provide an amplifier carried by the panel to direct sound forwardly through the stand panel. The amplifier may preferably be carried by a cabinet supported by the stand panel to project at the rear side of that panel and said opening, and the cabinet and stand may consist of wood, or have a wood finish, whereby sound from the amplifier impinges on the stand panel proximate the opening for producing resonating vibration of the panel, typically larger in outline than the cabinet or amplifiers. That panel may have the outline configuration of a guitar.

Yet another object is to provide a guide marker or markers on the front side of the panel, intersecting the sound passing opening to guide upright and centered placement of a guitar on the stand, and relative to said opening and said projections.

These and other objects and advantages of the invention, as well as the details of an illustrative embodiment, will be more fully understood from the following specification and drawings, in which:

DRAWING DESCRIPTION

DETAILED DESCRIPTION

Figure 4:
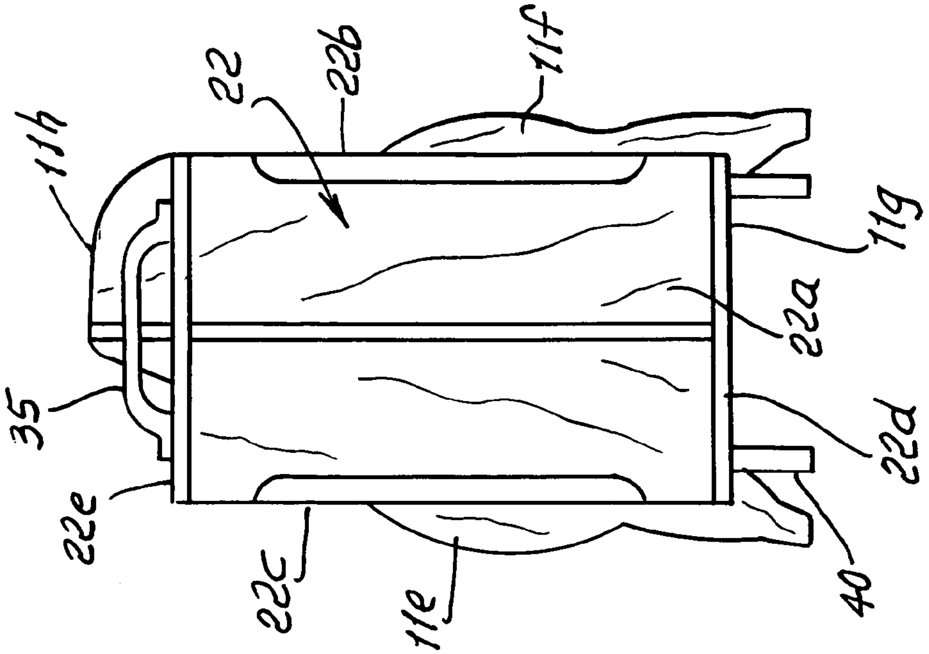
FIG. 4 is a rear view of the FIG. 1 cabinet and stand.
Figure 1:
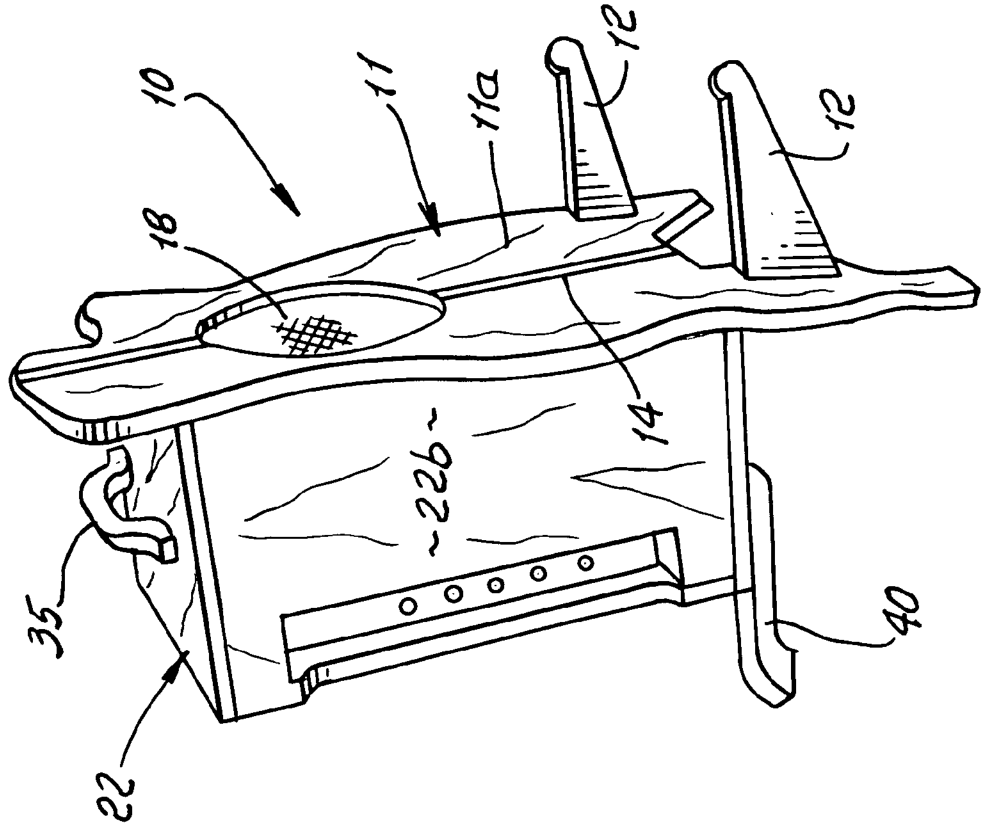
FIG. 1 is a perspective view of a guitar support stand, and an amplifier cabinet supported at the rear thereof.

In the drawings, showing a preferred form of the invention, a guitar support stand 10 includes an upright panel 11, inclined rearwardly to support a guitar against the panel front side 11*a*. Projections 12 carried by the panel, project forwardly, to support a lower edge or edges 13 of the guitar placed on the stand so that the back side of the guitar rests against panel front side 11*a*. Guided guitar placement is aided by a vertical marker or stripe 14, which bisects the distance between projections 12. The marker or stripe extends toward, and may intersect an opening 18 through the panel, at a vertical location as shown. Strips 14 may be omitted, if desired. A mesh 18*a* may extend over the opening, to protect a loudspeaker 20 located at the back side of the panel.

Also shown is a cabinet 22 at the back side of the panel, and typically having a rear side 22*a* and boundary sides 22*b*, 22*c*, 22*d*, and 22*e*, attached as at 23 to the panel 11. The front side of the cabinet may be open toward the panel opening 18.

Figure 3:
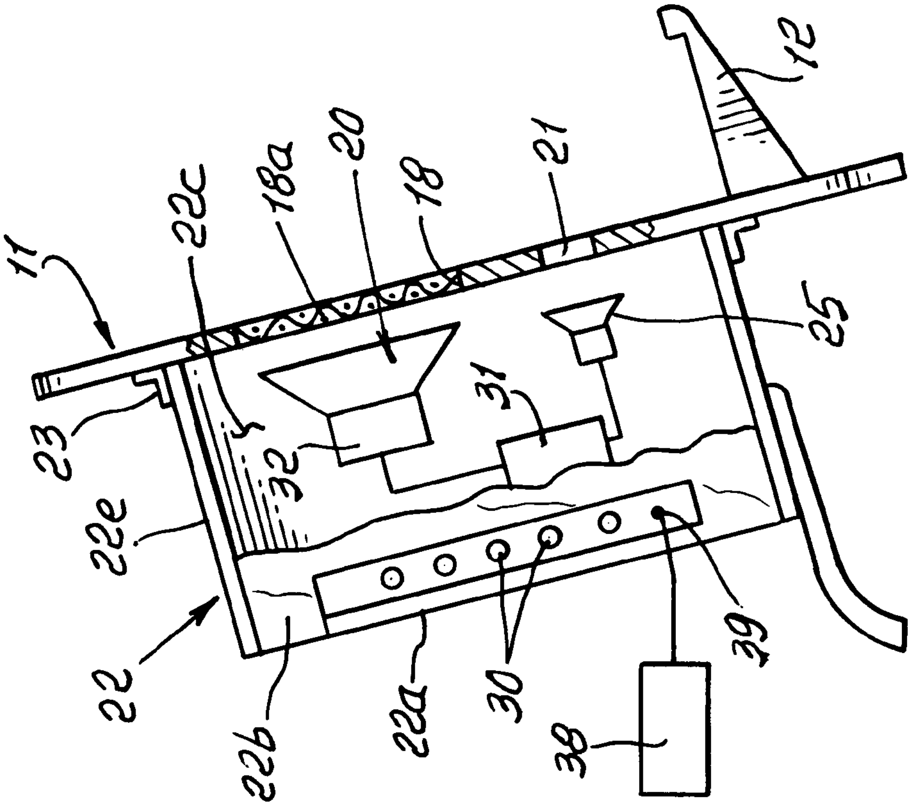
FIG. 3 is a side view, taken in section, showing the amplifier within the cabinet, in relation to the panel and its opening.
Figure 2:
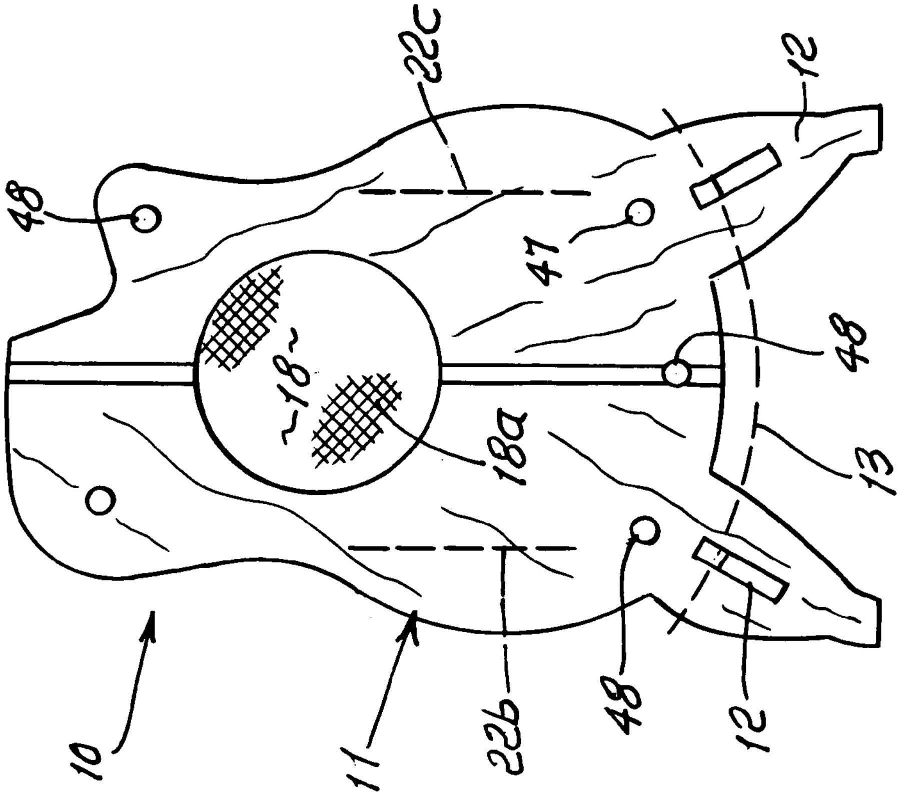
FIG. 2 is a frontal view of the stand of FIG. 1.

The speaker 20 is shown in the cabinet facing toward the sound passing opening 18, and sound from the speaker typically not only passes forwardly through the opening, but some sound impinges on the panel 11, causing it to resonate for sound production enhancement. This is further enhanced by the panel 11 top, bottom and side extents larger than the cabinet. A second and smaller speaker 25 is shown and may also be carried in the cabinet if desired. A second sound passing opening through the panel may also be provided, as at 27 in alignment with 25. The speaker 20 may be a woofer, and the speaker 25 may be a tweeter. Speaker controls are indicated at 30, and suitable speaker circuitry is shown at 31 and 32. The electronic circuitry of the guitar (indicated in FIG. 3 schematically at 38) may be wire connected to the speaker circuitry to the speaker circuitry, as via junction 39.

A rear cabinet support leg is shown at 40, and panel 11 support legs, are seen at 41, whereby the entirety of the cabinet may resonate with panel 11, above leg 40, in response to sound production within the cabinet and in response to resonating of panel 11, producing highly desirable speaker sound modulation. For this purpose, the panel and cabinet may consist of wood, and have a wood finish. Other materials may be used, for similar operation. Leg 40 also acts as a rearward support for the stand 10 and panel 11.

Note that the cabinet box is confined rearwardly of the panel 11, and is not visible from the front of the stand, the panel 11 being peripherally larger than the frontwardly projected periphery of the cabinet. See panel outer extents 11 *e, f, g* and *h*, in FIG. 4. A carrying handle for the assembly is shown at 35. Guitar support bottom or pads 47 are shown on 11 at 48.

See also U.S. Pat. No. 6,891,099B1 to applicant, incorporated herein by reference.

I claim:

1. In a sound amplifying guitar stand, the combination comprising a) a stand having a guitar back supporting panel extending upright and support legs, b) a sound amplifier and enclosure supported proximate to and at the rear of the panel, the amplifier free of electrical connection through the panel to any guitar, c) the panel configured to pass amplified audio sound forwardly, when a guitar is lifted off the stand, d) the stand also configured to support the guitar at the opposite side of the panel, relative to the amplifier, the amplifier everywhere spaced from said opposite side of the panel.

2. The combination of claim 1 wherein the amplifier has a speaker, and the panel defines a sound passing opening in sound passing registration with the amplifier speaker.

3. The combination of claim 2 wherein the amplifier is carried by the panel to direct sound forwardly through the panel opening.

4. The combination of claim 2 including a cabinet containing the amplifier and supported by the stand panel to project at the rear side of that panel and said opening, the panel inclined relative to vertical whereby the cabinet projects downwardly below the level of said opening and also extends beneath said opening.

5. The combination of claim 4 wherein the cabinet and stand panel have a wood finish at surfaces thereof.

6. The combination of claim 4 wherein the cabinet has exterior surfaces concealed within a rearward projection of stand panel edges configured as a guitar outline.

7. The combination of claim 4 wherein said opening is proximate the center of the panel.

8. The combination of claim 7 wherein guitar supporting projections extend outwardly from lower extent of the panel.

9. The combination of claim 8 including a guitar carried by said projections, to overlie said opening, at the back side of the guitar.

10. The combination of claim 9 including an upright guide marker on the panel to guide upright and centered placement of a guitar on the stand, and relative to said opening and said projections.

11. The combination of claim 4 including at least one loud speaker in the cabinet and positioned to produce sound some of which impinges on said stand panel for producing resonating vibration of the panel.

12. The combination of claim 11 including a second loudspeaker in the cabinet to produce amplified output from the guitar, and directed toward said stand panel.

13. The combination of claim 2 wherein there are multiple of said openings in the panel.

14. The combination of claim 1 wherein the amplifier has a speaker in alignment with a sound transmission path through the panel, and amplifier circuitry and components rearwardly of the panel.

15. The combination of claim 1 including stand support legs projecting downwardly from the panel and from the cabinet.

16. The combination of claim 15 wherein the stand panel is inclined rearwardly, and the cabinet is inclined downwardly and rearwardly.

17. The combination of claim 1 wherein the panel has the outline configuration of a guitar, or part thereof.

* * * * *